(12) United States Patent
Yoshino et al.

(10) Patent No.: US 7,182,240 B2
(45) Date of Patent: *Feb. 27, 2007

(54) SOLDER COATED LID

(75) Inventors: Hideyuki Yoshino, Ube (JP); Sanae Taniguchi, Minami-Saitama-gun (JP); Mitsuo Zen, Soka (JP); Takenori Azuma, Kasukabe (JP)

(73) Assignee: Senju Metal Industry Co., Ltd., Tokyo (JP)

(*) Notice: Subject to any disclaimer, the term of this patent is extended or adjusted under 35 U.S.C. 154(b) by 94 days.

This patent is subject to a terminal disclaimer.

(21) Appl. No.: 10/861,371

(22) Filed: Jun. 7, 2004

(65) Prior Publication Data

US 2004/0258948 A1     Dec. 23, 2004

Related U.S. Application Data

(63) Continuation of application No. 10/013,822, filed on Dec. 13, 2001, now abandoned.

(30) Foreign Application Priority Data

Dec. 14, 2000  (JP) .............................. 2000-380985

(51) Int. Cl.
*B23K 31/02*    (2006.01)

(52) U.S. Cl. .................................. 228/124.6; 228/248.1

(58) Field of Classification Search ............. 228/248.1, 228/124.6, 259; 438/106; 257/704; 174/50, 174/52.1
See application file for complete search history.

(56) References Cited

U.S. PATENT DOCUMENTS

| 4,331,258 A | * | 5/1982 | Geschwind ............... 220/359.5 |
| 4,356,047 A | * | 10/1982 | Gordon et al. ............... 427/123 |
| 4,746,583 A | * | 5/1988 | Falanga ...................... 428/632 |
| 5,057,376 A | * | 10/1991 | Sunahara et al. ........... 428/432 |
| 5,130,164 A | * | 7/1992 | Hutchison et al. .......... 427/123 |
| 5,414,300 A | * | 5/1995 | Tozawa et al. .............. 257/704 |
| 5,821,455 A | * | 10/1998 | Yamamoto et al. ........ 174/52.1 |
| 6,503,338 B1 | * | 1/2003 | Taguchi et al. ................ 148/23 |
| 6,758,387 B1 | * | 7/2004 | Zen ......................... 228/180.1 |

FOREIGN PATENT DOCUMENTS

JP         2004-55774     *   2/2004

* cited by examiner

*Primary Examiner*—Jonathan Johnson
(74) *Attorney, Agent, or Firm*—Michael Tobias

(57) ABSTRACT

A solder coated lid for a package for an electronic device has a lead-free solder layer comprising a Sn—Sb based solder with a liquidus temperature of at least 220 degrees C. provided on at least a region of the lid where the lid is to be joined to a base of a package. The lid can be joined to a base of a package at a low temperature, thereby reducing vaporization of solder components and adhesion thereof to electronic devices within the package.

13 Claims, 3 Drawing Sheets

SOLDER COATED LID

REFERENCE TO RELATED APPLICATIONS

This application is a continuation of patent application Ser. No. 10/013,822 filed on Dec. 13, 2001.

BACKGROUND OF THE INVENTION

1. Field of the Invention

This invention relates to a solder coated lid for a package for housing an electronic device, such as a semiconductor device, and to a package employing such a lid. In particular, it relates to a solder coated lid for a package for housing an electronic device which enables the package to be sealed without damaging electronic devices mounted in the package.

2. Description of the Related Art

In recent years, there has been a strong desire for decreases in the size and thickness of electronic equipment such as portable telephones and portable computers. At the same time, there has also been a great desire for decreases in the manufacturing costs of such electronic equipment.

As electronic equipment becomes smaller and thinner, it becomes easier for electronic components disposed therein, such as IC chips and quartz crystal units, to be adversely affected by heat, vibrations, and deformation at the time of manufacture. Mounting of electronic devices close to one another within electronic equipment tends to increase such problems.

FIG. 1(a) is a schematic cross-sectional elevation of a portion of a conventional package. In this example, a lid 18 is installed on the upper end 16 of a ceramic base 14 housing various electronic devices, such as a quartz crystal unit 12, connected to each other by wire bonding 10. FIG. 1(b) is an enlarged schematic exploded cross-sectional elevation showing the structure of the lid 18 and the upper end 16 of the ceramic base 14 in detail.

As shown in detail in FIG. 1(b), the upper end 16 of the base 14, which is made of an alumina ceramic, for example, is metallized with a tungsten layer 20 by the simultaneous sintering method or other suitable method. A nickel layer 22 is provided atop the tungsten layer 20, and the nickel layer 22 is covered by a silver brazing layer 24. A Kovar ring 26 (which is nickel plated on its surface) is installed atop the nickel layer 22, and then a Ni/Au layer 28 is provided atop the silver brazing layer 24.

The lid 18 comprises a body 19 made of Kovar, and the body 19 is plated to form a nickel film 30 on its surface. The lid 18 is installed on the upper end 16 of the base 14 of the package and is secured atop the Kovar ring 26 by seam welding.

This method of sealing a package involves numerous manufacturing steps, and installing the lid 18 through the ring 26 and performing brazing are difficult. Furthermore, this method has problems with respect to costs. In addition, with this sealing method, it is difficult to achieve reduce the size and thickness of the package. Thus, there is a need for improved methods and structures for sealing a package for electronic devices.

SUMMARY OF THE INVENTION

The present invention provides a lid for a package for an electronic device which can effectively realize decreases in the size and thickness of the package.

The present invention also provides a lid for a package for an electronic device having a simple structure and a low cost which enables sealing to be performed at a low temperature at which there is little vaporization of solder components.

Recently, due to concern for the environment, there has been a tendency towards the use of lead-free materials, and lead-free solder alloys have come to be widely used as solder alloys.

Therefore, the present invention also provides a lid for a package for an electronic device which uses a lead-free solder alloy for joining the lid to a base of the package.

The present invention additionally provides a package for an electronic device equipped with such a lid.

The present inventors found that by coating the body of a lid for a package with a lead-free solder, such as an Sn—Sb based lead-free solder, by hot dipping or cladding, the above-described problems of conventional sealing methods can be solved. Sealing of a package with such a solder coated lid can be performed at a low temperature at which there is little vaporization of solder components, so the solder does not have a harmful effect on electronic devices disposed within the package, and a package of high quality can be obtained.

According to one form of the present invention, a solder coated lid for a package for an electronic device has a lead-free solder layer comprising a Sn—Sb based solder with a liquidus temperature of at least 220 degrees C. provided on at least a region of the lid where the lid is to be joined to a base of a package. According to another form of the present invention, a solder coated lid for a package for an electronic device has a lead-free solder layer comprising an Sn—Ag—Cu based solder alloy.

A lid for a package according to the present invention is not limited to use with any particular type of package. In a preferred embodiment, the package is one for housing a quartz crystal unit, i.e., crystal resonator or crystal oscillator.

The lead-free solder layer may be formed directly atop a metal or alloy plate. Alternatively, an undercoat such as a nickel layer may be provided beneath the solder layer atop the metal or alloy plate.

According to another form of the present invention, a packaged electronic device comprises a base having a recess, an electronic device disposed in the recess, and a lid according to the present invention covering the recess and sealed to the base by soldering.

DESCRIPTION OF PREFERRED EMBODIMENTS

Figure 1A:
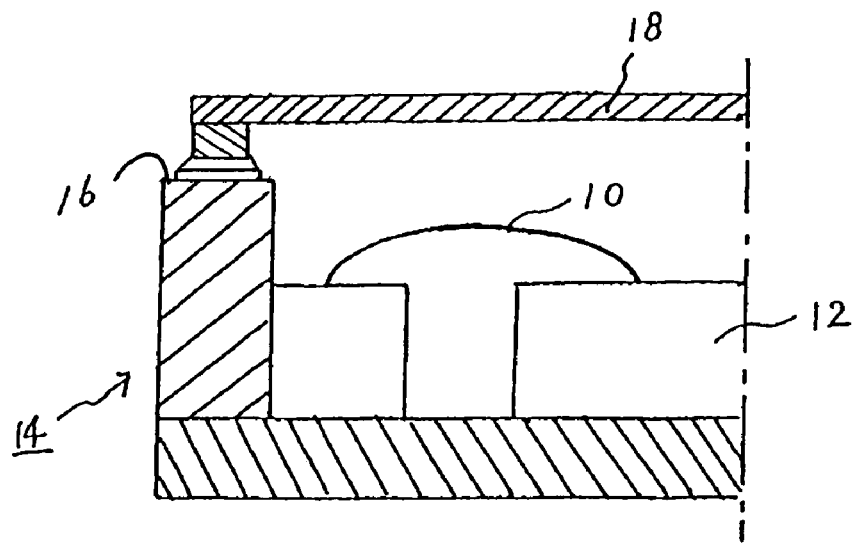
FIG. 1(a) is a schematic cross-sectional elevation of a package for an electronic device equipped with a lid of a known structure.

There are no particular restrictions on the type of package to be sealed with a lid according to the present invention. The package typically will include a base made of an electrically insulating material which can withstand the heating temperature at the time of sealing the package. A typical material having suitable properties is a ceramic. Accordingly, a lid according to the present invention will typically be used to seal a ceramic package having a base made of a ceramic material.

In the present invention, a ceramic material for a ceramic package may be any desired material conventionally used for ceramic packages, such as alumina, aluminum nitride, mullite, and glass ceramics. A ceramic base may be a singlelayer or multilayer member, and there are no restrictions on the method of its manufacture, on a method of forming internal wiring, or the like.

When a lid according to the present invention is flat, the package base will typically have a recess in which a semiconductor device or other electronic device is mounted. In this case, the lid will usually have a size so as to completely cover the recess. The lid is placed atop the recess and is then sealed to the base with a lead-free solder.

A ceramic base does not have joinability (wettability), so when a ceramic base is employed, it is necessary to form a suitable metal layer having excellent joinability on the portion of the base which is sealed to the lid, i.e., the upper surface of the base surrounding the recess. From the standpoint of maintaining joinability, this metal layer is preferably formed by performing Ni plating and Au plating after metallizing treatment with a metal having a high melting point, such as W or Mo. However, other types of metal layers used to seal a ceramic package can also be used in the present invention.

In one form of the present invention, a lid for sealing a package comprises a metal plate which is clad on one side thereof with a lead-free solder. The lead-free solder which is used to clad the metal plate melts at the time of sealing and forms an airtight seal between the lid and the base of the package. This thickness of the metal plate is preferably on the order of 0.1–1 mm, and the thickness of the cladding material is preferably on the order of 20–80 micrometers.

A clad plate can be manufactured by stacking a metal plate and a cladding material comprising a lead-free solder atop each other and subjecting them to cold or hot rolling. Either cold or hot rolling is preferably performed with a reduction in the range of 30–70%. A solder coated lid according to the present invention for sealing a package in an airtight manner can be manufactured from the clad metal plate by, for example, blanking with a press to obtain a desired shape and dimensions and then, if necessary, performing additional treatment such as drawing. Since the cladding material is flexible, it is easy to handle. Therefore, a lead-free solder coated lid according to the present invention can easily be mass produced, and it is extremely easy to handle. The cladding material will typically be coextensive in area with the metal plate on which it is clad, but it is also possible for it to have a smaller area than the metal plate.

There are no particular restrictions on the material used to form the metal plate for the lid, but preferably it is a material having a coefficient of thermal expansion close to that of the base of the package. When the base of the package is made of a ceramic, a few examples of suitable materials for the metal plate which forms the body of the lid are Alloy 42 (Fe-42Ni), Alloy 45 (Fe-45Ni), and Kovar (Fe-29Ni-17Co).

The cladding material which is used to clad the metal plate comprises a lead-free solder, such as an Sn—Sb based solder alloy, having a liquidus temperature of at least 220 degrees C.

According to another form of the present invention, a solder alloy layer is formed on a lid by hot dipping.

Figure 2:
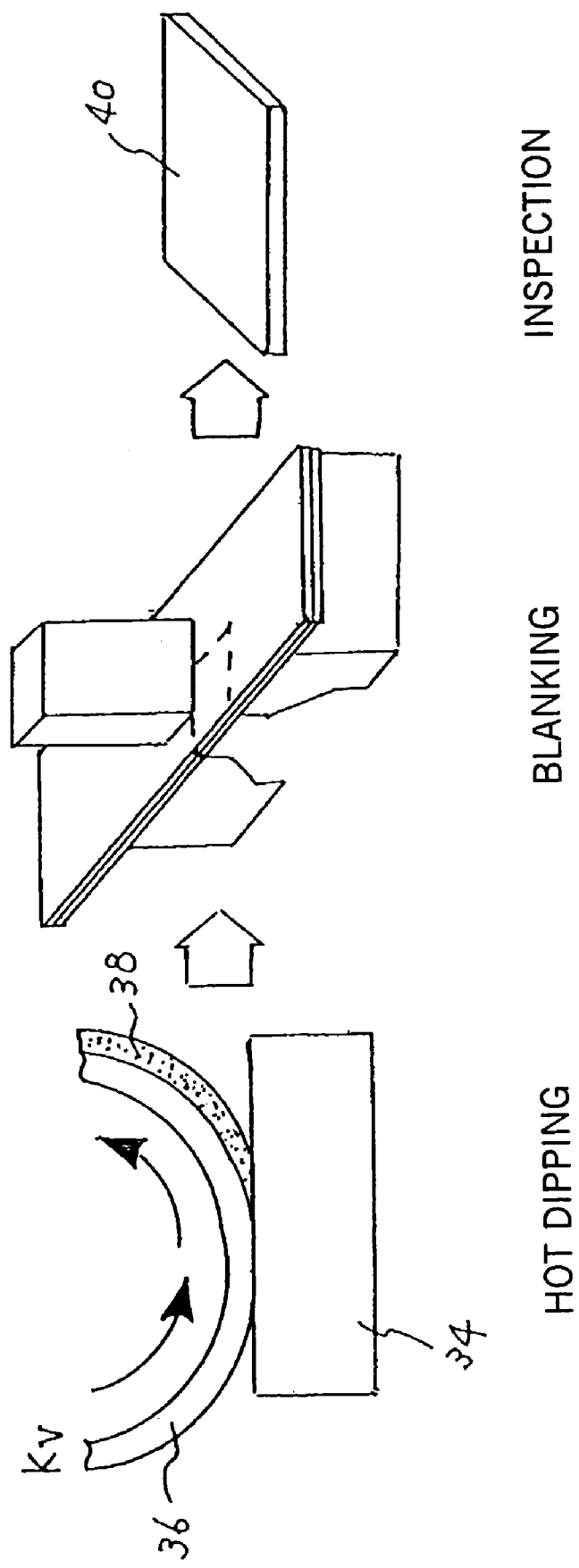
FIG. 2 is a schematic view of manufacturing steps in a method of manufacturing a solder coated lid according to the present invention.

FIG. 2 is a schematic diagram showing steps in an example of a method of manufacturing a solder coated lid according to the present invention by hot dipping. In this method, a metal strip 36 of Kovar, Alloy 42, Alloy 45, or other suitable material is continuously immersed in a molten solder bath 34 while moving in the direction of the arrows. In this example, hot dip plating is performed on only one side of the strip to form a lead-free solder layer 38. However, it is also possible to coat both sides of the metal strip 36 with solder.

The metal strip 36 on which the solder layer 38 is formed by hot dipping can then formed into a lid having a prescribed shape and dimensions by blanking. After inspection of the lid, secondary working such as drawing may be performed, if necessary, to obtain a completed solder coated lid 40.

The solder used for hot dipping is a lead-free solder alloy, such as an Sn—Sb based alloy, having a liquidus temperature of at least 220 degrees C. One example of a suitable alloy is a Sn-5% Sb alloy. If necessary, Ag, Cu, and the like may be added in suitable amounts.

It is also possible to employ an Sn—Ag—Cu based solder alloy (such as an alloy containing Ag: greater than 3.0% and at most 5.0%, Cu: 0.1–3.0% and preferably 0.5–3.0%, if necessary Sb: at most 5%, and a remainder of Sn).

Figure 1B:
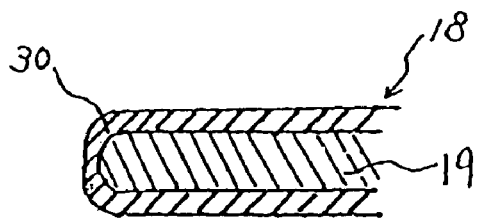
FIG. 1(b) is an enlarged schematic exploded cross-sectional elevation of a portion of the package of FIG. 1(a).
Figure 1B:
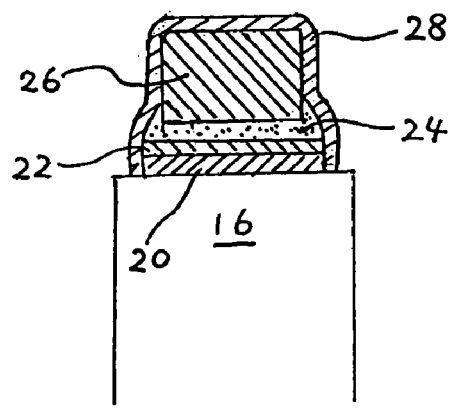
Figure 3:
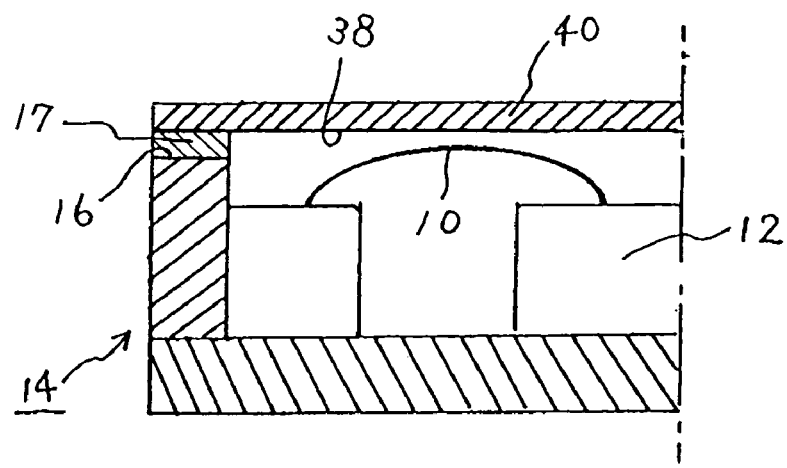
FIG. 3 is a schematic cross-sectional elevation of a package for an electronic device equipped with a solder coated lid according to the present invention.

FIG. 3 is a schematic cross-sectional elevation of a package which is sealed with a solder coated lid according to the present invention which was manufactured in the manner shown in FIG. 2. The present invention will be described based on the solder coated lid, since the sealing effect of a clad lid is substantially the same as that of the solder coated lid. In this figure, the same elements as in FIG. 1 are indicated by the same reference numbers.

When using such a solder coated lid according to the present invention, a W—Ni—Au metal film 17 is provided on the upper end 16 of the package base 14, the solder coated lid 40 is mounted directly on the film 17, and sealing can be carried out by heating of the solder to melt the solder layer and join the lid 40 to the base 14. In contrast to the package of FIG. 1, a package employing a lid according to the present invention does not require a Kovar ring at the upper end 16 of the package base 14, so fewer manufacturing steps are required to prepare the base 14 for sealing.

In this example, a solder layer 38 is provided over the entire lower surface of the lid 40, but it is possible to provide a solder layer 38 only in the region of the lid 40 which directly contacts the upper end 16 of the package base 14 or in a slightly larger region. In that case, the amount of solder needed for coating the lid is reduced, and material costs are decreased. In addition, the opportunity for solder components to vaporize during sealing is decreased, so a deterioration in the properties of electronic devices disposed in the base 14 due to contamination by solder components during sealing can be avoided.

Since a solder coated lid according to the present invention employs a lead-free solder, the lid does not cause environmental pollution from the use of lead.

A lead-free solder alloy comprising 5% Sb and a remainder substantially of Sn has a solidus temperature of 240 degrees C. and a liquidus temperature of 243 degrees C., which are higher than the melting points of solders used for mounting of packages on a substrate, so the lead-free solder alloy does not melt when a sealed package is subsequently mounted on a printed circuit board or other substrate.

The same advantages can be obtained whether the solder layer is formed by hot dipping or by cladding.

In the present invention, sealing of a lid to a base of a package can be performed at a low temperature. A low sealing temperature provides the significant advantage that there is little vaporization of solder components during sealing. When a package being sealed contains a quartz crystal unit (crystal resonator), if In or Sn adheres to an Au circuit on the surface of the crystal resonator, variations in oscillating properties take place, and the resonator may be unable to operate in the desired manner. Therefore, up to now, solder has not been used for sealing of packages for crystal resonators due to possible contamination of the crystal resonators by components of the solder.

However, according to the present invention, the sealing temperature can be decreased, and adhesion of In and Sn to the surface of an Au circuit of an electronic device in a package, such as a crystal resonator, can be effectively prevented.

A solder coated lid according to the present invention can be used for packages for all types of semiconductor devices as well as other types of electronic devices. As described above, it is particularly advantageous for use with a package housing a quartz crystal unit, e.g., crystal resonator or quartz crystal oscillator, since sealing can be performed at a low temperature, but it can also be used with packages for IC chips and SAW filter elements, for example.

EXAMPLES

In this example, the surface of a lid body made of Kovar was coated with a solder layer having the composition shown in Table 1 either by hot dipping or by cladding to obtain a solder coated lid.

TABLE 1

| Solder composition | Sn:Sb = 95:5 |
|---|---|
| Lid body | Kovar |
| Coating method | hot dipping or cladding |

Hot dipping of the solder was carried out in the manner shown in FIG. 2 by dipping only one side of a metal strip in a molten solder bath.

After coating, blanking was performed to obtain a flat lid having desired dimensions.

A solder coated lid according to the present invention was also formed by a cladding method employing rolling.

A solder coated lid according to the present invention which was manufactured in this manner by hot dipping or cladding was then used to seal an actual package for an electronic device. The sealing conditions are summarized below.

seal structure: same as in FIG. 3 sealing conditions:
 profile: at least 240 degrees C. for 4+1 minutes, peak of 270+10 degrees C (a peak temperature of 300 degrees C. is also possible)
 Load: 5 g/pc (in the case of a 3.8 mm×3.8 mm PKG)
 atmosphere: $N_2$ The temperature profile was as follows.
 peak temperature: 300+10 degrees C.
 holding time at 280 degrees C.: 4+1 minutes
 degassing region: temperature: 240–280 degrees C.
 holding time: 4+1 minutes
 atmosphere: $N_2$
 load: 5 grams per 3.6×3.6 mm
 Various tests were performed on the coated lids obtained in this manner.

The results are shown in Table 2 and Table 3.

Table 2 shows sealing airtightness (G/L). In almost every case, an airtight seal was achieved both initially and after passage through a furnace.

Table 3 shows the results of an environmental test carried out to evaluate reliability. It can be seen that there were no problems with respect to reliability even after passing two times through a furnace even at a mounting temperature using a lead-free solder.

TABLE 2

| Sealing Temperature (° C.) | | 240 | 260 | 280 | 300 |
|---|---|---|---|---|---|
| Hot Dipping | Initial | 1/30 | 0/30 | 0/30 | 0/30 |
| | After passage | 0/29 | 0/30 | 0/30 | 0/30 |
| Cladding | Initial | 1/30 | 0/30 | 0/30 | 0/30 |
| | After passage | 0/29 | 0/30 | 0/30 | 0/30 |

TABLE 3

| | Conditions | Airtightness Reliability (Rej./N) |
|---|---|---|
| Mounting Temperature Heating | Passing 2 times through furnace at temperature of at least 220° C. for 6 minutes, peak temperature of 270° C. | 0/320 pc |
| ↓ An environmental test was performed on the above samples | | |
| Resistance to temperature cycle | −65° C. ⇔150° C. 2000 cycles | 0/240 pc |
| Resistance to thermal shock | −65° C. ⇔150° C. 100 cycles | 0/80 pc |

Figure 4:
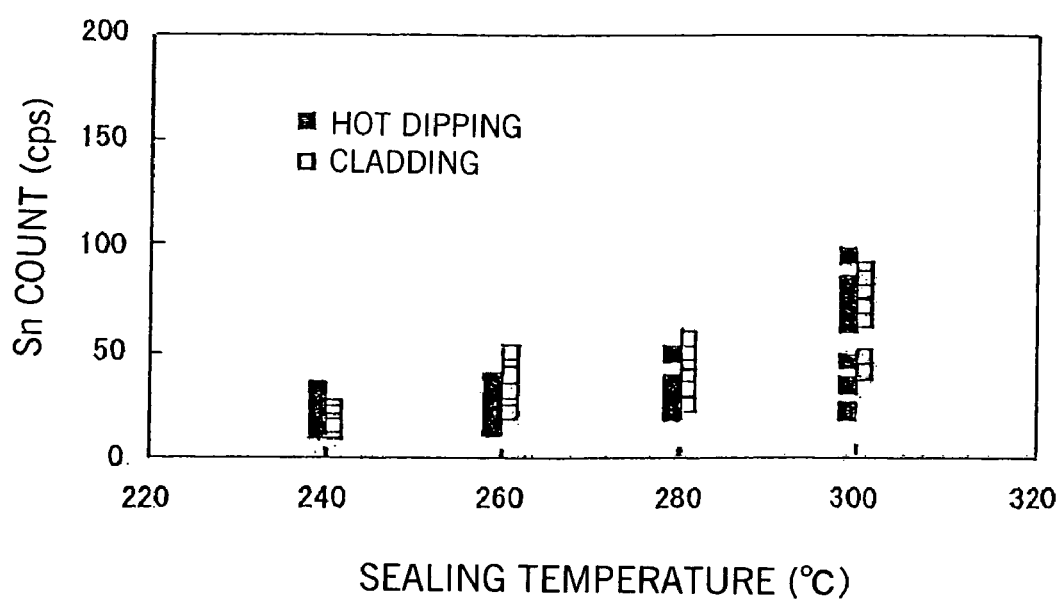
FIG. 4 is a graph showing the amount of evaporated Sn as a function of sealing temperature for examples of a solder coated lid according to the present invention.

FIG. 4 is a graph showing the relationship between the sealing temperature after lid sealing and the Sn count for a solder coated lid according to the present invention. According to the present invention, the amount of vaporized Sn at the time of sealing, i.e., the amount of adhesion of Sn to an Au surface was small. Particularly in a temperature range of 240–280 degrees C., which is a preferred temperature range for sealing, the vaporization of solder components and the amount of adhesion were extremely small using a coated lid formed by either hot dipping or cladding. Thus, it can be seen that a lid according to the present invention can be applied to a package for a crystal resonator. The amount of vaporization when using a Pb alloy solder was 200 cps.

As described above, a solder coated lid according to the present invention is coated with a lead-free solder alloy having a liquidus temperature of at least 220 degrees C., so a low sealing temperature is possible. Due to the low sealing temperature, contamination of electronic components due to vaporization of solder components during sealing can be largely suppressed. Therefore, the present invention has great practical value.

What is claimed is:

1. A method of forming a solder coated lid for a package for an electronic device comprising dipping a metal strip having first and second sides in a molten bath of a lead-free solder to form a solder layer on the entire first side but not on the second side of the strip, and then forming the strip into a plurality of individual lids.

2. A method as claimed in claim 1 wherein forming the strip into lids comprises punching the lids from the strip.

3. A method as claimed in claim 1 wherein the strip comprises a Fe—Ni based alloy, the method including forming an undercoat on the alloy prior to forming the solder layer by dipping.

4. A method as claimed in claim 3 wherein the undercoat comprises a nickel layer.

5. A method as claimed in claim 1 wherein the lead-free solder has a liquidus temperature of at least 220 degrees C.

6. A method as claimed in claim 5 wherein the lead-free solder comprises an Sn—Sb based solder.

7. A method as claimed in claim 5 wherein the lead-free solder comprises an Sn—Ag—Cu based solder.

8. A method of forming a package for an electronic device comprising:

preparing a lid by the method claimed in claim 1;

disposing the lid on a base having an electronic device disposed in a recess of the base with the solder layer facing the base; and heating the lid to melt the solder layer and solder the lid to the base.

9. A method as claimed in claim 8 wherein the electronic device comprises a quartz crystal unit.

10. A method as claimed in claim 6 wherein the lead-free solder comprises a Sn-5Sb solder.

11. A method as claimed in claim 7 wherein the lead-free solder contains greater than 3.0 to at most 5.0% of Ag, 0.1–3.0% of Cu, at most 5% of Sb, and a remainder of Sn.

12. A method as claimed in claim 11 wherein the lead-free solder contains 0.5–3.0% of Cu.

13. A method as claimed in claim 8 wherein the base comprises a ceramic.

* * * * *